United States Patent
Park et al.

(10) Patent No.: US 12,205,776 B2
(45) Date of Patent: Jan. 21, 2025

(54) ORGANIC-INORGANIC HYBRID SOLAR CELL AND METHOD FOR MANUFACTURING ORGANIC-INORGANIC HYBRID SOLAR CELL

(71) Applicant: LG CHEM, LTD., Seoul (KR)

(72) Inventors: Sang Jun Park, Daejeon (KR); Yun Hye Hahm, Daejeon (KR); Jong Seok Kim, Daejeon (KR); Yongnam Kim, Daejeon (KR); Seiyong Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/760,016

(22) PCT Filed: Sep. 21, 2018

(86) PCT No.: PCT/KR2018/011245
§ 371 (c)(1),
(2) Date: Apr. 28, 2020

(87) PCT Pub. No.: WO2019/088450
PCT Pub. Date: May 9, 2019

(65) Prior Publication Data
US 2020/0350125 A1 Nov. 5, 2020

(30) Foreign Application Priority Data
Nov. 1, 2017 (KR) .................. 10-2017-0144643

(51) Int. Cl.
*H01L 31/00* (2006.01)
*H01G 9/00* (2006.01)
(Continued)

(52) U.S. Cl.
CPC ......... *H01G 9/2009* (2013.01); *H01G 9/0036* (2013.01); *H10K 30/30* (2023.02);
(Continued)

(58) Field of Classification Search
None
See application file for complete search history.

(56) References Cited

U.S. PATENT DOCUMENTS 6,335,479 B1 * 1/2002 Yamada ............ H01L 31/02167
136/251
10,079,356 B2 9/2018 Etgar
(Continued)

FOREIGN PATENT DOCUMENTS

CN 103347974 10/2013
CN 103764752 4/2014
(Continued)

OTHER PUBLICATIONS

Chen et al., A study of Inverted-Type Perovskite Solar Cells with Various Composition Ratios of (FAPbI3)1-x(MAPbBr3)x, Nanomaterials (Basel), 2016, Oct. 13, 2016 (Year: 2016).*
(Continued)

*Primary Examiner* — Thanh Truc Trinh
(74) *Attorney, Agent, or Firm* — Bryan Cave Leighton Paisner LLP

(57) ABSTRACT

An organic-inorganic hybrid solar cell and method for manufacturing the same wherein the solar cell includes a first electrode, a first common layer provided on the first electrode, a light absorption layer including a perovskite material provided on the first common layer, a second common layer provided on the light absorption layer, and a conductive adhesive layer provided on the second common layer.

6 Claims, 2 Drawing Sheets

(51) Int. Cl.
  *H01G 9/20* (2006.01)
  *H10K 30/30* (2023.01)
  *H10K 30/82* (2023.01)
  *H10K 30/88* (2023.01)
  *H10K 85/20* (2023.01)
  *H10K 85/30* (2023.01)

(52) U.S. Cl.
  CPC .............. *H10K 30/82* (2023.02); *H10K 30/88* (2023.02); *H10K 85/20* (2023.02); *H10K 85/221* (2023.02); *H10K 85/30* (2023.02)

(56) References Cited

U.S. PATENT DOCUMENTS

| | | | |
|---|---|---|---|
| 10,263,207 | B2 | 4/2019 | Lee et al. |
| 2004/0041131 | A1 | 3/2004 | Fukushima et al. |
| 2011/0100415 | A1* | 5/2011 | Osamura .................... C09J 7/22 |
| | | | 428/40.1 |
| 2012/0012153 | A1 | 1/2012 | Azechi et al. |
| 2012/0012164 | A1* | 1/2012 | Sugiura ................... B32B 27/40 |
| | | | 136/251 |
| 2012/0216864 | A1* | 8/2012 | Gauthier ............... H01L 51/448 |
| | | | 136/263 |
| 2013/0224474 | A1 | 8/2013 | Theunissen et al. |
| 2015/0299519 | A1* | 10/2015 | Nishijima ............... C09J 123/22 |
| | | | 156/60 |
| 2015/0299523 | A1* | 10/2015 | Park .......................... C09J 9/00 |
| | | | 428/354 |
| 2016/0005547 | A1 | 1/2016 | Seok et al. |
| 2016/0137887 | A1 | 5/2016 | Yoo et al. |
| 2016/0276611 | A1* | 9/2016 | Oooka ................. H01L 51/442 |
| | | | 136/256 |
| 2017/0101556 | A1* | 4/2017 | Keite-Telgenbuscher ................... |
| | | | H01L 23/293 |
| 2017/0229668 | A1* | 8/2017 | Stapleton ............... H10K 71/60 |
| 2018/0309002 | A1 | 10/2018 | Bang et al. |

FOREIGN PATENT DOCUMENTS

| | | | |
|---|---|---|---|
| CN | 103903675 | | 7/2014 |
| CN | 104009159 | | 8/2014 |
| CN | 104022226 | | 9/2014 |
| CN | 104134752 | | 11/2014 |
| CN | 105008476 | A | 10/2015 |
| EP | 3136450 | A1 | 3/2017 |
| JP | 2007-217693 | | 8/2007 |
| JP | 2008-209584 | | 9/2008 |
| JP | 2016-149472 | | 8/2016 |
| KR | 10-2011-0133605 | | 12/2011 |
| KR | 20120078875 | | 7/2012 |
| KR | 10-1461641 | | 12/2014 |
| KR | 10-1571528 | | 11/2015 |
| KR | 10-20150124413 | | 11/2015 |
| KR | 10-20150135202 | | 12/2015 |
| KR | 10-20150143010 | | 12/2015 |
| KR | 10-20160055093 | | 5/2016 |
| KR | 10-1706438 | | 2/2017 |
| KR | 10-2017-0072079 | | 6/2017 |
| KR | 10-20170070451 | | 6/2017 |
| KR | 10-1782733 | | 9/2017 |
| WO | WO 2016/038338 | * | 3/2016 .............. C01G 21/00 |

OTHER PUBLICATIONS

Huang et al., "An alternative flexible electrode for dye-sensitized solar cells", J Nanopart Res (2012), pp. 1-5. (Year: 2012).*

Chen et al., "Ion exchange resin/polystyrene sulfonate composite membranes for PEM fuel cells", Journal of Membrane Science 243 (2004) 327-333. (Year: 2004).*

Alzamil et al., "Temperature Coefficients of Electrical Conductive and Conduction Mechanisms in Butyl Rubber-Carbon Black Composites", Journal of Electronic Materials, vol. 47, No. 2, 2018. (Year: 2017).*

Bryant et al., "A Transparent Conductive Adhesive Laminate Electrode for High-Efficiency Organic-Inorganic Lead Halide Perovskite Solar Cells," Adv. Mater., published Sep. 25, 2014, pp. 7499-7504, vol. 26.

Spyropoulos, G. et al., "Organic and perovskite solar modules innovated by adhesive top electrode and depth-resolved laser patterning," Energy & Environmental Science, 9:2302-2313 (2016), DOI:10.1039/C6EE01555G.

* cited by examiner

[Figure 1]
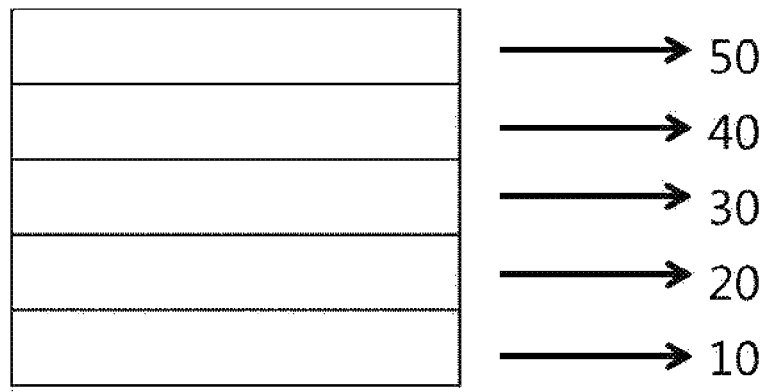
[Figure 2]
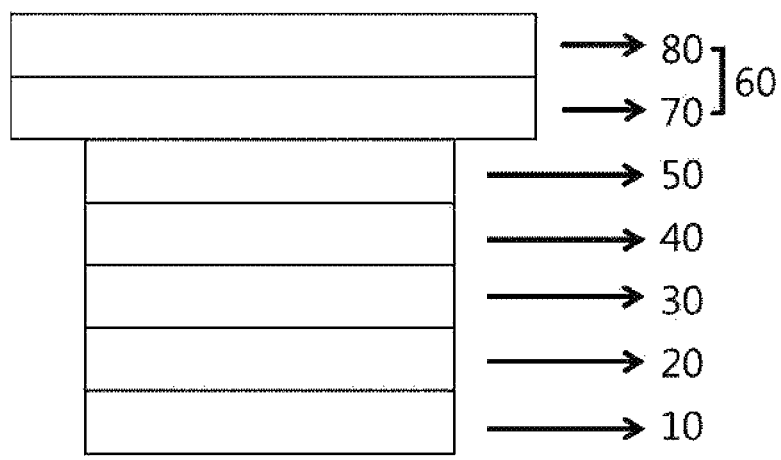
[Figure 3]
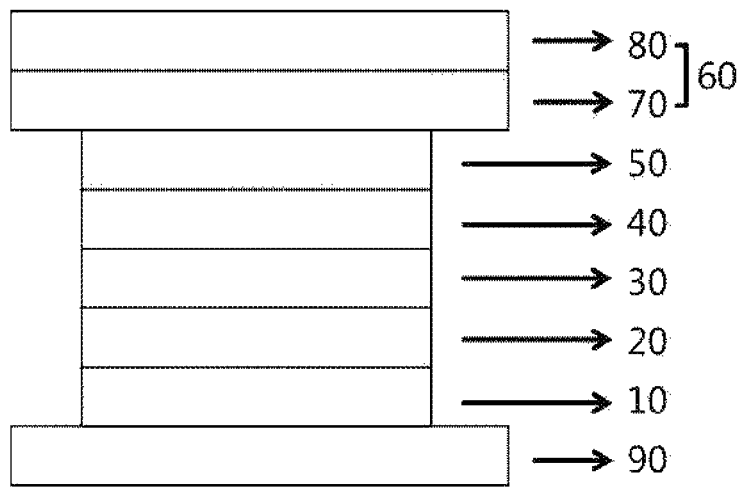

[Figure 4]
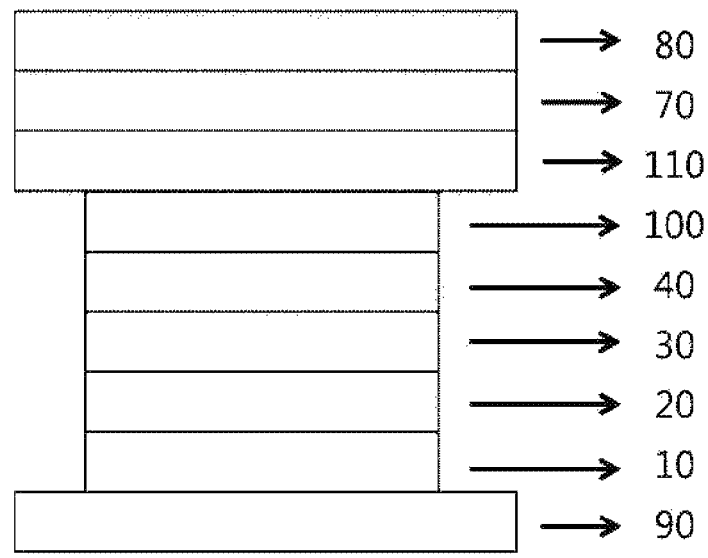
[Figure 5]
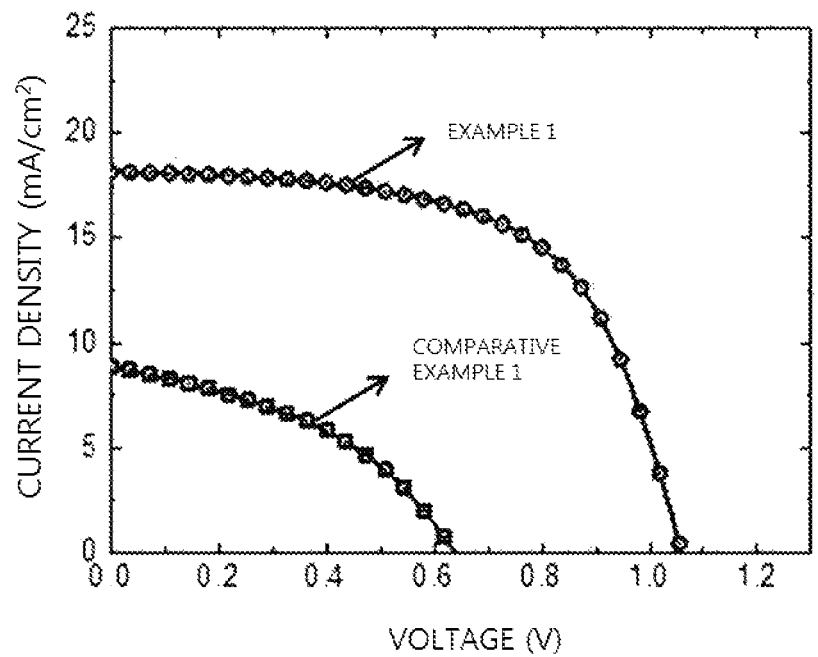

ORGANIC-INORGANIC HYBRID SOLAR CELL AND METHOD FOR MANUFACTURING ORGANIC-INORGANIC HYBRID SOLAR CELL

This application is a National Stage Application of International Application No. PCT/KR2018/011245 filed on Sep. 21, 2018, which claims priority to and the benefit of Korean Patent Application No. 10-2017-0144643 filed in the Korean Intellectual Property Office on Nov. 1, 2017, the entire contents of which are incorporated herein by reference.

TECHNICAL FIELD

The present specification relates to an organic-inorganic hybrid solar cell and a method for manufacturing an organic-inorganic hybrid solar cell.

BACKGROUND

In order to solve the global environmental problems caused by the depletion of fossil fuels and the use thereof, studies have been actively conducted on alternative energy sources, which may be regenerated and are clean, such as solar energy, wind power, and water power. Among them, interests in solar cells which change electric energy directly from the sunlight have been greatly increased. Here, the solar cell means a cell which produces current-voltage by using a photovoltaic effect of absorbing photoenergy from the sunlight to generate electrons and holes.

In order to commercialize the solar cell, it is necessary to be able to reduce the manufacturing cost and increase the area. Accordingly, studies have been conducted on methods for manufacturing a solar cell, to which a roll-to-roll (R2R) process is applied in order to reduce the manufacturing cost, and among them, a need for developing an atmospheric pressure solution-type R2R process is emerging.

However, in the existing process of manufacturing a solar cell, most of the upper electrodes are formed by a printing process through a metal vacuum deposition or conductive ink, so that there is a limitation in reducing the manufacturing cost and the material cost.

Meanwhile, in solar cells, organic-inorganic complex perovskite materials have recently drawn attention as a light absorbing material for organic-inorganic hybrid solar cells due to the characteristics in which the absorption coefficient is high and the material can be easily synthesized through a solution process. However, since the upper electrode of the organic-inorganic hybrid solar cell is also formed by a printing process through a metal vacuum deposition or conductive ink, the above-described problems with the process and cost occur equally.

Accordingly, there is a need for studies on the formation of a new upper electrode, which can be mass-produced at a low price, and the production of a film-type solar cell.

Technical Problem

The present specification relates to an organic-inorganic hybrid solar cell and a method for manufacturing an organic-inorganic hybrid solar cell.

Technical Solution

An exemplary embodiment of the present specification provides an organic-inorganic hybrid solar cell including:

a first electrode;
a first common layer provided on the first electrode;
a light absorption layer including a perovskite material provided on the first common layer;
a second common layer provided on the light absorption layer; and
a conductive adhesive layer provided on the second common layer so as to be brought into contact with the second common layer.

Another exemplary embodiment of the present specification provides a method for manufacturing an organic-inorganic hybrid solar cell, the method including:

forming a first structure including: a first electrode, a first common layer, a light absorption layer including a perovskite material, and a second common layer;
preparing a conductive adhesive layer; and
laminating the second common layer and the conductive adhesive layer so as to be brought into contact with each other.

Advantageous Effects

An organic-inorganic hybrid solar cell according to an exemplary embodiment of the present specification has excellent efficiency and stability.

A method for manufacturing an organic-inorganic hybrid solar cell according to an exemplary embodiment of the present specification can manufacture an organic-inorganic hybrid solar cell which is manufactured by a simple process and has excellent efficiency because the formation of an upper electrode and an encapsulation layer is not separately performed.

The organic-inorganic hybrid solar cell according to an exemplary embodiment of the present specification enables a flexible device to be manufactured.

BRIEF DESCRIPTION OF THE DRAWINGS

FIGS. 1 to 3 are views illustrating an organic-inorganic hybrid solar cell according to an exemplary embodiment of the present specification.

FIG. 4 is a view illustrating a general organic-inorganic hybrid solar cell.

FIG. 5 is a view illustrating a current density according to a voltage in each of the organic-inorganic hybrid solar cells manufactured in exemplary embodiments of the present specification.

10: First electrode
20: First common layer
30: Light absorption layer
40: Second common layer
50: Conductive adhesive layer
60: Base material
70: Metal foil
80: Protective film
90: Substrate
100: Second electrode
110: Adhesive layer

DETAILED DESCRIPTION

Hereinafter, the present specification will be described in detail.

When one part "includes" one constituent element in the present specification, unless otherwise specifically described, it does not mean that another constituent element is excluded, but means that another constituent element may be further included.

When one member is disposed "on" another member in the present specification, it means not only a case where the one member is brought into contact with another member, but also a case where another member is also present between the two members.

An exemplary embodiment of the present specification provides an organic-inorganic hybrid solar cell including:
a first electrode;
a first common layer provided on the first electrode;
a light absorption layer including a perovskite material provided on the first common layer;
a second common layer provided on the light absorption layer; and
a conductive adhesive layer provided on the second common layer so as to be brought into contact with the second common layer.

FIG. 1 illustrates a structure of an organic-inorganic hybrid solar cell according to an exemplary embodiment of the present specification. Specifically, FIG. 1 illustrates an organic-inorganic hybrid solar cell in which a first electrode 10, a first common layer 20, a light absorption layer 30, a second common layer 40, and a conductive adhesive layer 50 are sequentially stacked.

In an exemplary embodiment of the present specification, the organic-inorganic hybrid solar cell may further include a base material on the conductive adhesive layer.

In an exemplary embodiment of the present specification, the base material includes a barrier film. In this case, the barrier film serves to protect the organic-inorganic hybrid solar cell from the external environment (for example, moisture and oxygen).

In an exemplary embodiment of the present specification, the barrier film may be a metal foil. A metal of the metal foil may include one or more selected from the group consisting of silver (Ag), aluminum (Al), copper (Cu), molybdenum (Mo), nickel (Ni), iron (Fe), and palladium (Pd), or an alloy thereof. Specifically, the metal may be an alloy of iron and nickel such as Invar, aluminum (Al), copper (Cu), or iron (Fe).

In an exemplary embodiment of the present specification, the base material further includes a protective film. In this case, the protective film is disposed at the outermost part of a device, and serves to prevent scratches and contamination.

In an exemplary embodiment of the present specification, in the protective film, it is possible to use a Teflon-based polymer such as polytetrafluoroethylene (PTET); polyvinylidene fluoride (PVDF), triacetyl cellulose (TAC), polyethylene terephthalate (PET), a cycloolefin polymer (COP), an acrylic film, and the like either alone or in a mixture thereof.

FIG. 2 illustrates a structure of an organic-inorganic hybrid solar cell in which a base material is included on a conductive adhesive layer. Specifically, FIG. 2 illustrates an organic-inorganic hybrid solar cell in which a first electrode 10, a first common layer 20, a light absorption layer 30, a second common layer 40, a conductive adhesive layer 50, and a base material 60 are sequentially stacked. Specifically, FIG. 2 illustrates an organic-inorganic hybrid solar cell in which a first electrode 10, a first common layer 20, a light absorption layer 30, a second common layer 40, a conductive adhesive layer 50, a metal foil 70, and a protective film 80 are sequentially stacked.

In an exemplary embodiment of the present specification, the organic-inorganic hybrid solar cell may further include a substrate on the lower portion of the first electrode.

FIG. 3 illustrates an organic-inorganic hybrid solar cell in which a substrate is provided. Specifically, FIG. 3 illustrates an organic-inorganic hybrid solar cell in which a substrate 90, a first electrode 10, a first common layer 20, a light absorption layer 30, a second common layer 40, a conductive adhesive layer 50, a metal foil 70, and a protective film 80 are sequentially stacked.

In an exemplary embodiment of the present specification, the conductive adhesive layer serves as both an upper electrode and an adhesive layer in an organic-inorganic hybrid solar cell in the related art.

FIG. 4 illustrates a structure of an organic-inorganic hybrid solar cell in the related art. Specifically, FIG. 4 illustrates an organic-inorganic hybrid solar cell in the related art, in which a second electrode (upper electrode) and an adhesive layer are separately provided. More specifically, FIG. 4 illustrates a structure of an organic-inorganic hybrid solar cell in the related art, in which a substrate 90, a first electrode 10, a first common layer 20, a light absorption layer 30, a second common layer 40, a second electrode 100, an adhesive layer 110, a metal foil 70, and a protective film 80 are sequentially provided.

In an exemplary embodiment of the present specification, the perovskite material may be a compound of Formula 1 or 2.

$$AMX_3 \quad \text{Formula 1}$$

$$B_a B'_{(1-a)} M'X'_z X''_{(3-z)} \quad \text{Formula 2}$$

In Formula 1 or 2,
B and B' are different from each other,
A, B, and B' are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
M and M' are the same as or different from each other, and are each independently a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$,
X, X' and X" are each independently a halogen ion,
n is an integer from 1 to 9,
a is a real number such that $0<a<1$, and
z is a real number such that $0<z<3$.

In an exemplary embodiment of the present specification, A and B are the same as or different from each other. In addition, A and B' are the same as or different from each other.

In an exemplary embodiment of the present specification, the perovskite material in the light absorption layer may include a single cation. In the present specification, the single cation means that one kind of monovalent cation is used. That is, A in Formula 1 means that only one kind of monovalent cation is selected. For example, A in Formula 1 is $C_nH_{2n+1}NH_3^+$, and n may be an integer from 1 to 9.

In an exemplary embodiment of the present specification, the compound having the perovskite structure in the light absorption layer may include a complex cation. In the present specification, the complex cation means that two or more kinds of monovalent cations are used. That is, in Formula 2, B and B' each mean that different monovalent cations are selected. For example, B and B' in Chemical 2 may be $C_nH_{2n+1}NH_3^+$ and $HC(NH_2)_2^+$, respectively.

In an exemplary embodiment of the present specification, the perovskite material is represented by Formula 1.

In an exemplary embodiment of the present specification, the perovskite material is represented by Formula 2.

In an exemplary embodiment of the present specification, A, B, and B' are each $C_nH_{2n+1}NH_3^+$ or $HC(NH_2)_2^+$. In this case, B and B' are different from each other.

In an exemplary embodiment of the present specification, A is $CH_3NH_3^+$ or $HC(NH_2)_2^+$.

In an exemplary embodiment of the present specification, A and B are each $CH_3NH_3^+$.

In an exemplary embodiment of the present specification, B' is $HC(NH_2)_2^+$.

In an exemplary embodiment of the present specification, M and M' are $Pb^{2+}$.

In an exemplary embodiment of the present specification, X' and X" are different from each other.

In an exemplary embodiment of the present specification, X, X', and X" are each F or Br.

In an exemplary embodiment of the present specification, a is a real number of $0<a<1$, such that the sum of B and B' becomes 1. Furthermore, z is a real number of $0<z<3$, such that the sum of X' and X" becomes 3.

In an exemplary embodiment of the present specification, the perovskite material is $CH_3NH_3PbI_3$, $HC(NH_2)_2PbI_3$, $CH_3NH_3PbBr_3$, $HC(NH_2)_2PbI_3$, or $(CH_3NH_3)_a(HC(NH_2)_2)_{(1-a)}I_zBr_{(3-z)}$, n is an integer from 1 to 9, a is a real number of $0<a<1$, and z is a real number of $0<z<3$.

In an exemplary embodiment of the present specification, a first common layer and a second common layer each mean an electron transport layer or a hole transport layer. In this case, the first common layer and the second common layer are not the same layer. For example, when the first common layer is an electron transport layer, the second common layer is a hole transport layer, and when the first common layer is a hole transport layer, the second common layer is an electron transport layer.

In an exemplary embodiment of the present specification, the conductive adhesive layer includes a conductive material and an adhesive material.

In an exemplary embodiment of the present specification, a mass ratio of the adhesive material and the conductive material in the conductive adhesive layer may be 1:99 to 99:1. Specifically, the mass ratio may be 20:80 to 80:20.

In an exemplary embodiment of the present specification, the conductive material in the conductive adhesive layer may be present in a form of being dispersed.

In an exemplary embodiment of the present specification, the conductive material includes a carbon-based material or metal particles.

In an exemplary embodiment of the present specification, the carbon-based material is at least one of carbon black, carbon nanotube (CNT), graphite, graphene, activated carbon, mesoporous carbon, carbon fiber, and carbon nano wire.

In an exemplary embodiment of the present specification, as the metal nanoparticles, generally used conductive metal particles may be used, and specifically, the metal particles may be at least one of gold (Au), platinum (Pt), silver (Ag), copper (Cu), nickel (Ni), or an alloy thereof.

In an exemplary embodiment of the present specification, the conductive adhesive layer is formed by using a conductive adhesive composition, and the conductive adhesive composition includes a conductive material and an adhesive material.

In an exemplary embodiment of the present specification, a content of the conductive material in the conductive adhesive composition is 1 wt % to 40 wt %. Specifically, the content is 10 wt % to 40 wt %. More specifically, the content is 15 wt % to 40 wt %. There are problems in that when the content of the conductive material in the conductive adhesive composition is less than 1 wt %, the conductivity deteriorates, and when the content of the conductive material is more than 40 wt %, the adhesive strength deteriorates.

Further, the content of the conductive material satisfies the above range, so that conductivity of the conductive adhesive layer is excellent, and a sheet resistance value equal to or less than several hundred ohm may be exhibited.

In an exemplary embodiment of the present specification, the conductive adhesive composition may include a solvent-free adhesive material.

In an exemplary embodiment of the present specification, the conductive adhesive composition may include an adhesive material with a solvent.

In an exemplary embodiment of the present specification, the adhesive material includes an adhesive composition or a cured product of an adhesive composition. In this case, the adhesive composition can be used without limitation as long as the adhesive composition is a material used in the art. For example, the adhesive composition may be a material which is present in a liquid phase before being cured and converted into a solid phase after being cured.

In an exemplary embodiment of the present specification, the adhesive composition may be included in an uncured state. In the present specification, the "curing" means a process in which an adhesive material is converted into a state capable of exhibiting an adhesive performance by a chemical or physical action or reaction of components included in an adhesive layer.

In an exemplary embodiment of the present specification, the adhesive composition may include a polymer derived from butylene. Since the polymer derived from butylene has low polarity, is transparent, and is rarely affected by corrosion, there is an effect capable of implementing excellent moisture blocking characteristics and durability when the polymer derived from butylene is used as an adhesive material.

In the present specification, the "polymer derived from butylene" means that one or more of the polymerization units of the polymer consist of butylene.

In an exemplary embodiment of the present specification, the polymer derived from butylene may be a single polymer of a butylene monomer, a copolymer obtained by copolymerizing a butylene monomer and other polymerizable monomer, a reactive oligomer using a butylene monomer, or a mixture thereof.

In an exemplary embodiment of the present specification, the butylene monomer may be, for example, 1-butene, 2-butene, or isobutylene, and the different monomer capable of being polymerized with the butylene monomer may be, for example, isoprene, styrene or butadiene, but is not limited thereto.

In an exemplary embodiment of the present specification, the polymer derived from butylene may be, for example, a butyl rubber, but is not limited thereto.

In an exemplary embodiment of the present specification, the adhesive composition may include a polyfunctional polymerizable compound. The polyfunctional polymerizable compound may be, specifically, a polyfunctional active energy ray polymerizable compound which may be polymerized by irradiation of an active energy ray.

In an exemplary embodiment of the present specification, the polyfunctional active energy ray polymerizable compound may be a compound including two or more of a functional group which may participate in a polymerization reaction by irradiation of an active energy ray, for example, a functional group including an ethylenically unsaturated double bond such as an acryloyl group or a methacryloyl group; an epoxy group; or a functional group such as an oxetane group. Specifically, the polyfunctional active energy ray polymerizable compound may be, for example, 1,4- butanediol di(meth)acrylate, 1,3-butyleneglycoldi(meth)acrylate, 1,6-hexanedioldi(meth)acrylate, 1,8-otanedioldi(meth)acrylate, 1,12-dodecanedioldi(meth)acrylate, and trimethylolpropane triacrylate, but is not limited thereto.

In an exemplary embodiment of the present specification, the adhesive composition may further include one or more additive materials of a tackifier, a moisture adsorbent, a moisture blocker, a dispersant, a photoinitiator, a thermal initiator, or a radical initiator.

In an exemplary embodiment of the present specification, the blending ratio of the additive material is not particularly limited, and may be appropriately selected in consideration of a desired viscosity of a conductive adhesive layer, an adhesive property to be implemented after curing, and the like.

In an exemplary embodiment of the present specification, the tackifier can be used without limitation as long as the tackifier is a material having good compatibility with an adhesive composition and an excellent moisture blocking property. For example, the tackifier may be a hydrogenated hydrocarbon resin, a hydrogenated ester-based resin, or a hydrogenated dicyclopentadiene-based resin, but is not limited thereto.

In an exemplary embodiment of the present specification, the moisture absorbent can be used without limitation as long as the moisture absorbent is a material which is used in the art. For example, the moisture absorbent may be an organic metal oxide such as aluminum oxide octylate; a sulfate such as magnesium sulfate, sodium sulfate, or nickel sulfate; or a metal oxide of phosphorus pentoxide ($P_2O_5$), lithium oxide ($Li_2O$), sodium oxide ($Na_2O$), barium oxide (BaO), calcium oxide (CaO), or magnesium oxide (MgO), but is not limited thereto.

In the present specification, the "moisture blocker" means a material which has no or low reactivity with moisture, or blocks or prevents migration of moisture in the material. As the moisture blocker, for example, one or more of clay, silica, zeolite, titania, and zirconia may be used, but the moisture blocker is not limited thereto.

In an exemplary embodiment of the present specification, the photoinitiator, the thermal initiator, or the radical initiator can be used without limitation as long as it is a material used in the art.

In an exemplary embodiment of the present specification, a content of the adhesive material in the conductive adhesive composition is 1 wt % to 60 wt %. Specifically, the content may be 5 wt % to 50 wt %, and more specifically, may be 10 wt % to 30 wt %. There are problems in that when the content of the adhesive material is more than 60 wt %, the compatibility with the conductive material is low, and when the content of the adhesive material is equal to or less than 1 wt %, adhesive characteristics deteriorate.

In an exemplary embodiment of the present specification, the conductive adhesive layer may have a viscosity at room temperature of $10^6$-dyne·sec/cm$^2$ or more, preferably $10^7$-dyne·sec/cm$^2$ or more. In this case, the "room temperature" means a natural temperature without being warmed or cooled, and may mean a temperature of, for example, about 15° C. to about 35° C., more specifically about 20° C. to about 25° C., and even more specifically about 25° C. The viscosity may be measured by using an advanced rheometric expansion system (ARES).

In an exemplary embodiment of the present specification, it is possible to form a conductive adhesive layer having a uniform thickness, in which the processability of the work is smooth in the process of manufacturing an organic-inorganic hybrid solar cell by adjusting the viscosity of the conductive adhesive layer within the range. Furthermore, it is possible to prevent a physical or chemical damage from being imposed on an organic-inorganic hybrid solar cell by significantly reducing problems of shrinkage, volatile gases, and the like which may be generated by the curing of a resin, and the like. In the present invention, the upper limit of the viscosity is not particularly limited as long as the conductive adhesive layer maintains a solid phase or semi-solid phase state at room temperature, and the upper limit may be controlled within a range of about $10^9$-dyne·sec/cm$^2$ or less in consideration of, for example, processability, and the like.

In an exemplary embodiment of the present specification, for the adhesive strength of the conductive adhesive layer, the peel strength after pre-bonding the film under the conditions of 30° C., 1 MPa, and 1 second to 2 seconds may be preferably 100 gf/cm or more, more preferably 300 gf/cm or more, and even more preferably 500 gf/cm or more.

In an exemplary embodiment of the present specification, for the peel strength, after a conductive adhesive material (hereinafter, referred to as a conductive adhesive film) formed on a PET release film was left to stand at room temperature (25° C.) for 1 hour, the conductive adhesive film was cut into a certain size (a width of the film was 1.5 mm) and pre-bonded with a pattern-less glass under the pre-bonding conditions of 1 MPa and 1 second at an actually measured temperature of 30° C., and then the PET release film was removed. And then, a bonding tape (manufactured by Nitto Denko Corporation) cut into a width of 1.5 mm and a length by 5 cm longer than that of the conductive adhesive film pre-bonded on the glass was positioned on the conductive adhesive film from which the PET release film was removed, and the adhesive tape and the conductive adhesive film were bonded to each other by running a rubber roller twice. By the aforementioned method, three test specimens of the conductive adhesive film were prepared, the peel strength was measured by using UTM, and then the average value thereof was calculated.

In an exemplary embodiment of the present specification, a sheet resistance value of the conductive adhesive layer is 0.01 Ω/sq to 100 Ω/sq. Accordingly, the conductive adhesive layer is suitably used as an electrode of the organic-inorganic hybrid solar cell.

In an exemplary embodiment of the present specification, the sheet resistance may be measured by using a sheet resistance measurement system publicly-known according to a 4-point probe method. For the sheet resistance, after a resistance value (V/I) is measured by measuring the current (I) and the voltage (V) with four probes, the sheet resistance is obtained (V/I×W/L) by using a distance (L) between electrodes for measuring the area (cross-sectional area, W) and resistance of a sample, and a resistance correction factor (RCF) is multiplied in order to calculate the sheet resistance as Ω/sq which is a sheet resistance unit.

The resistance correction factor may be calculated by using the size and thickness of the sample and the temperature at the time of measurement, and may be calculated by Poisson's equation. The sheet resistance of the entire stacked body may be measured and calculated in the stacked body itself, the sheet resistance of each layer may be measured before forming a layer consisting of the other materials except for a target layer to be measured in the entire stacked body, may be measured after removing a layer consisting of the other materials except for a target layer to be measured in the entire stacked body, or may be measured after forming a layer under the same conditions as those of the target layer by analyzing a material for the target layer. For example, a sheet resistance value of the conductive adhesive layer may be measured by using a 4-point probe after separately manufacturing only a conductive adhesive layer.

In an exemplary embodiment of the present specification, a conductive adhesive composition may be dissolved in a solvent and used in order to form the conductive adhesive layer. In this case, a solvent can be used without limitation as long as the solvent is a material used in the art, and the solvent may be, for example, an ether-based solvent, such as cyclopentyl methyl ether, di-tert-butyl ether, dibutyl ether, diethyl ether, diisopropyl ether, 1,4-dioxane, ethyl tert-butyl ether, polyethylene glycol, and tetrahydrofuran.

In an exemplary embodiment of the present specification, the first electrode may be a transparent electrode, and the solar cell may absorb light by way of the first electrode.

In an exemplary embodiment of the present specification, when the first electrode is a transparent electrode, as the first electrode, it is possible to use an electrode in which a material having conductivity is doped on a flexible and transparent material such as plastic including polyethylene terephthalate (PET), polyethylene naphthalate (PEN), polypropylene (PP), polyimide (PI), polycarbonate (PC), polystyrene (PS), polyoxyethylene (POM), an AS resin (acrylonitrile styrene copolymer), an ABS resin (acrylonitrile butadiene styrene copolymer), triacetyl cellulose (TAC), polyarylate (PAR), and the like, in addition to glass and a quartz plate. Specifically, the first electrode may be indium tin oxide (ITO), fluorine doped tin oxide (FTO), aluminum doped zinc oxide (AZO), indium zinc oxide (IZO), ZnO—$Ga_2O_3$, ZnO—$Al_2O_3$, antimony tin oxide (ATO), and the like, and more specifically, the first electrode may be ITO.

In an exemplary embodiment of the present specification, the first electrode may also be a semi-transparent electrode. When the first electrode is a semi-transparent electrode, the first electrode may be manufactured of a metal such as silver (Ag), gold (Au), magnesium (Mg), or an alloy thereof.

In the present specification, as the substrate, it is possible to use a substrate having excellent transparency, surface smoothness, ease of handling, and waterproofing property. Specifically, a glass substrate, a thin film glass substrate, or a plastic substrate may be used. The plastic substrate may include a flexible film such as polyethylene terephthalate (PET), polyethylene naphthalate (PEN), polyether ether ketone, and polyimide in the form of a single layer or a multi-layer. However, the substrate is not limited thereto, and a substrate typically used for an organic-inorganic hybrid solar cell may be used.

Another exemplary embodiment of the present specification provides a method for manufacturing an organic-inorganic hybrid solar cell, the method including: forming a first structure including: a first electrode, a first common layer, a light absorption layer including a perovskite material, and a second common layer;
preparing a conductive adhesive layer; and
laminating the second common layer and the conductive adhesive layer so as to be brought into contact with each other.

In an exemplary embodiment of the present specification, the forming of the first structure includes:
preparing a first electrode;
forming a first common layer on the first electrode;
forming a light absorption layer including a perovskite material on the first common layer; and
forming a second common layer on the light absorption layer.

In this case, the materials for the first electrode, the first common layer, the perovskite material, and the second common layer are the same as those described above.

In an exemplary embodiment of the present specification, the conductive adhesive layer may be in a state where the conductive adhesive layer further includes a base material on a surface opposite to a portion which is brought into contact with the second common layer. In this case, the base material is the same as that described above.

In an exemplary embodiment of the present specification, the preparing of the conductive adhesive layer includes applying a conductive adhesive composition on a release film, and then drying or curing the conductive adhesive composition. In this case, as the release film, a material can be used without limitation as long as the material is used in the art, and the release film may be a PET film.

For example, in an exemplary embodiment of the present specification, the preparing of the conductive adhesive layer may be preparing a second structure in which a PET release film, a conductive adhesive, and a base material are sequentially stacked.

In an exemplary embodiment of the present specification, the laminating of the second common layer and the conductive adhesive layer so as to be brought into contact with each other may be performed after one surface of the conductive adhesive layer is positioned on the second common layer of the first structure. Specifically, the laminating of the second common layer and the conductive adhesive layer so as to be brought into contact with each other may be performed after positioning one surface of the second common layer in the first structure and one surface of the conductive adhesive layer from which the PET release film is removed so as to be brought into contact with each other. That is, the laminating of the second common layer and the conductive adhesive layer so as to be brought into contact with each other may be performed such that after the lamination, the second common layer and the conductive adhesive layer are sequentially provided, or the second common layer, the conductive adhesive layer, and the base material are sequentially provided.

In general, in manufacturing an organic-inorganic hybrid solar cell, when an upper electrode is applied to a conductive organic material or ink, the efficiency is decreased due to high resistance characteristics of the material. Further, when the upper electrode is formed of a metal by a vacuum deposition method, an increase in process cost is caused by switching from atmospheric atmosphere to vacuum atmosphere or from vacuum atmosphere to atmospheric atmosphere. In addition, since an encapsulation layer needs to be separately adhered onto the thus formed upper electrode, there is a problem in that a process is added.

In the present specification, the "encapsulation layer" means a material by which an adhesive layer and a base material are stacked. Specifically, the encapsulation layer may be a material by which an adhesive layer, a barrier film, and a protective film are sequentially stacked. More specifically, the encapsulation layer may be a material by which an adhesive layer, a metal foil, and a protective film are sequentially stacked. In this case, the adhesive layer may be formed of the above-described adhesive composition.

In the present specification, the "encapsulation film" means a film in which the encapsulation layer is manufactured in the form of a film.

In contrast, the method for manufacturing an organic-inorganic hybrid solar cell according to an exemplary embodiment of the present specification has an effect of simplifying the process and improving the efficiency without any damage to the conductive material by directly laminating a conductive adhesive layer in which an upper electrode and an adhesive layer are integrated on a second common layer. Furthermore, since an upper electrode is not directly processed on the upper portion of a device in which a light absorption layer and common layers are completed, a range of a usable material can be expanded, and particularly, an alcohol-based solvent can be used, so that it is possible to effectively improve the performance of a conductive adhesive film without any degradation in the light absorption layer and the common layers.

In an exemplary embodiment of the present specification, the laminating of the second common layer and the conductive adhesive layer so as to be brought into contact with each other is performed by using a roll at 20° C. to 100° C. That is, since a device is completed by using a roll-to-roll process, the process thereof is simple and an electrode may be formed under atmospheric pressure conditions, so that the organic electronic device can be used by a continuous production process.

In an exemplary embodiment of the present specification, the forming of the light absorption layer includes coating each of a solution including an organic halide and a solution including a metal halide on an upper portion of the first common layer or coating a solution including both an organic halide and a metal halide on an upper portion of the first common layer.

In an exemplary embodiment of the present specification, the organic halide may be a material represented by the following Formula 3 or 4.

$$AX \qquad \text{Formula 3}$$

$$B'_a B''_{(1-a)} X'_z X''_{(1-z)} \qquad \text{Formula 4}$$

In Formula 3 or 4,

B and B' are different from each other, and A, B, and B' are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, X' and X" are different from each other, X, X', and X" are each a halogen ion, n is an integer from 1 to 9, y is a real number of 0<y<1, and z is a real number of 0<z<1.

In an exemplary embodiment of the present specification, the metal halide may be a material represented by the following Formula 5.

$$MX'''_2 \qquad \text{Formula 5}$$

In Formula 5,

M is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X''' is a halogen ion.

In an exemplary embodiment of the present specification, A, B, and B' may be each $CH_3NH_3$ or $HC(NH_2)_2$.

In an exemplary embodiment of the present specification, M, M', and M" may be each $Pb^{2+}$.

In an exemplary embodiment of the present specification, X, X', X", and X''' may be an iodine (I) ion or a bromine (Br) ion.

In an exemplary embodiment of the present specification, the organic halide may be $CH_3NH_3I$, $HC(NH_2)_2I$, $CH_3NH_3Br$, $HC(NH_2)_2Br$, or $(CH_3NH_3)_a(HC(NH_2)_2)_{(1-a)}I_zBr_{(1-z)}$, y may be a real number of 0<y<1, and z may be a real number of 0<z<1.

In an exemplary embodiment of the present specification, the metal halide may be $PbI_2$, $PbBr_2$, or $PbIBr$.

In the present specification, the organic-inorganic hybrid solar cell may have an n-i-p structure. The n-i-p structure of the organic-inorganic hybrid solar cell in the related art is a structure in which a first electrode, an electron transport layer, a light absorption layer, a hole transport layer, a second electrode, and an encapsulation layer are sequentially stacked, and has problems in that the efficiency due to a material for a second electrode is decreased, and when the second electrode is a metal electrode, process costs are increased due to the vacuum deposition of the metal.

In contrast, the n-i-p structure of the organic-inorganic hybrid solar cell according to an exemplary embodiment of the present specification is a structure in which a first electrode, an electron transport layer, a light absorption layer, a hole transport layer, and a conductive adhesive layer are sequentially stacked, and the process thereof is simple because a second electrode and an encapsulation layer are not separately formed.

In the present specification, the organic-inorganic hybrid solar cell may have a p-i-n structure. The p-i-n structure of the organic-inorganic hybrid solar cell in the related art is a structure in which a first electrode, a hole transport layer, a light absorption layer, an electron transport layer, a second electrode, and an encapsulation layer are sequentially stacked, and has problems in that the efficiency due to a material for a second electrode is decreased, and when the second electrode is a metal electrode, process costs are increased due to the vacuum deposition of the metal.

In contrast, the p-i-n structure of the organic-inorganic hybrid solar cell according to an exemplary embodiment of the present specification is a structure in which a first electrode, a hole transport layer, a light absorption layer, an electron transport layer, and a conductive adhesive layer are sequentially stacked, and the process thereof is simple because a second electrode and an encapsulation layer are not separately formed.

In the present specification, the organic-inorganic hybrid solar cell may further include an additional layer provided between the first electrode and the conductive adhesive layer. Specifically, according to an exemplary embodiment of the present specification, the additional layer may include one or more selected from the group consisting of a hole injection layer, a hole transport layer, an electron blocking layer, an electron transport layer, and an electron injection layer.

In the present specification, a material for the hole transport layer and/or the electron transport layer may be a material which increases the probability that charges produced move to an electrode by efficiently transferring electrons and holes to a light absorption layer, but is not particularly limited.

In the present specification, the electron transport layer may include a metal oxide. As the metal oxide, it is possible to specifically use one or two or more selected from Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, In oxide, Ta oxide, SrTi oxide, and a composite thereof, but the metal oxide is not limited thereto.

In the present specification, the electron transport layer may improve characteristics of charges by using doping, and may modify a surface of the electron transport layer by using a fluorene derivative, and the like.

In the present specification, the electron transport layer may be formed by being applied onto one surface of a first electrode or coated in the form of a film by using a method such as sputtering, E-Beam, thermal deposition, spin coating, screen printing, inkjet printing, doctor blade, or gravure printing.

In the present specification, the hole transport layer may be an anode buffer layer.

The hole transport layer may be introduced into the upper portion of the light absorption layer by a method such as spin coating, dip coating, inkjet printing, gravure printing, spray coating, doctor blade, bar coating, gravure coating, brush painting, and thermal deposition.

The hole transport layer may use tertiary butyl pyridine (TBP), lithium bis(trifluoro methanesulfonyl)imide (LiTFSI), poly(3,4-ethylenedioxythiophene):poly(4-styrenesulfonate) [PEDOT:PSS], and the like, but the material is not limited thereto.

In the present specification, the first structure means a structure in which a substrate, a first electrode, a first common layer, a light absorption layer, and a second common layer are sequentially stacked. Specifically, in an exemplary embodiment of the present specification, the first structure may have a structure in which a substrate, a first electrode, an electron transport layer, a light absorption layer, and a hole transport layer are sequentially formed.

In the present specification, the second structure means a structure in which a PET release film, a conductive adhesive, and a base material are sequentially stacked.

Mode for Invention

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

Example 1. Organic-Inorganic Hybrid Solar Cell Manufactured by Laminating First Structure and Second Structure (1) Manufacture of First Structure On a substrate, a base material was formed by using a PI varnish, and a first electrode at a level of 80 Ω/sq was formed through ITO sputtering. The base material, on which the first electrode was formed, was washed in ethanol for 20 minutes by using ultrasonic waves. Thereafter, a 2 wt % $TiO_2$ dispersed solution (manufactured by ANP Co., Ltd.) was coated onto the ITO substrate by a spin-coating method, and heat-treated at 150° C. for 30 minutes to form an electron transport layer. After a dimethylformamide (DMF) solution, in which $(HC(NH_2)_2)_{0.85}(CH_3NH_3)_{0.15}PbI_{2.55}Br_{0.45}$ perovskite at a concentration of about 50 wt % was dissolved, was spin-coated onto the electron transport layer, the spin-coated solution was heat-treated at 100° C. for 30 minutes to form a black light absorption layer. Sequentially, a hole transport layer was formed by spin-coating, on the light absorbing layer, a solution obtained by mixing 80 mg of spiro-OMeTAD (2,2',7,7'-tetrakis(N,N-di-p-methoxyphenylamine)-9,9'-spirobifluorene), 28.5 μl of tert-butylpyridine (tBP), and an acetonitrile solution (520 mg LiTESI/1 ml acetonitrile) of acetonitrile mixed with 17.5 μl of bis(trifluoromethane)sulfonimide lithium salt (LiTFSI) mixed with 1 ml of chlorobenzene, thereby manufacturing a first structure.

(2) Manufacture of Second Structure

An adhesive layer solution was made as follows. An adhesive composition was formed by introducing 50 g of a butyl rubber (Br068, manufactured by EXXON) as a polymer derived from butylene, 24 g of a hydrogenated hydrocarbon resin (Eastotac H-100L) as a tackifier, 15 g of trimethylolpropane triacrylate as a polyfunctional active energy ray polymerizable compound, and 1 g of 2,2-dimethoxy-1,2-diphenylethane-1-one (Irgacure 651, manufactured by Ciba Specialty Chemicals Inc.) as a radical initiator. Thereafter, 50 parts by weight of carbon flake based on 100 parts by weight of the above-described materials was added and dispersed, and a conductive adhesive coating solution was produced by diluting the solid content so as to be approximately 20 wt % with toluene. A conductive adhesive layer having a thickness of 50 μm was formed by applying the prepared solution on a release surface of a release PET film, and drying the release PET film at 100° C. in an oven for 30 minutes. Thereafter, a second structure having a structure of a PET release layer, a conductive adhesive layer, and a copper film was manufactured by laminating a 20 μm-thick copper film with the release PET film on which the conductive adhesive layer was formed.

(3) Completion of Organic-Inorganic Hybrid Solar Cell

In order to laminate a first structure and a second structure manufactured by the aforementioned method, a heated roll laminator was used. After a first structure and a second structure from which a PET release layer was removed were laminated at a temperature of 100° C., a flexible film-type organic-inorganic hybrid solar cell was completed by performing deaeration under a vacuum degree of 100 Pa and a pressure of 0.5 MPa under a temperature condition between 25° C. and 100° C. using a vacuum laminating apparatus.

Comparative Example 1. Organic-Inorganic Hybrid Solar Cell Manufactured by Laminating Encapsulation Film on Upper Electrode On a substrate, a base material was formed by using a PI varnish, and a first electrode at a level of 80 Ω/sq was formed through ITO sputtering. The base material, on which the first electrode was formed, was washed in ethanol for 20 minutes by using ultrasonic waves. Thereafter, a 2 wt % $TiO_2$ dispersed solution (manufactured by ANP Co., Ltd.) was coated onto the ITO substrate by a spin-coating method, and heat-treated at 150° C. for 30 minutes to form an electron transport layer. After a dimethylformamide (DMF) solution, in which $(HC(NH_2)_2)_{0.85}(CH_3NH_3)_{0.15}PbI_{2.55}Br_{0.45}$ perovskite at a concentration of about 50 wt % was dissolved, was spin-coated onto the electron transport layer, the spin-coated solution was heat-treated at 100° C. for 30 minutes to form a black light absorption layer. Sequentially, a hole transport layer was formed by spin-coating, on the light absorbing layer, a solution obtained by mixing 80 mg of spiro-OMeTAD (2,2',7,7'-tetrakis(N,N-di-p-methoxyphenylamine)-9,9'-spirobifluorene), 28.5 μl of tert-butylpyridine (tBP), and an acetonitrile solution (520 mg LiTESI/1 ml acetonitrile) of acetonitrile mixed with 17.5 μl of bis(trifluoromethane)sulfonimide lithium salt (LiTFSI) with 1 ml of chlorobenzene. Thereafter, an upper electrode having a thickness of 20 μm was formed by bar-coating a conductive carbon paste, and finally, a flexible film-type organic-inorganic hybrid solar cell was completed by laminating a commercially available encapsulation film (FSA DL-01, manufactured by LG Chem.) using a room temperature roll laminator, and then performing deaeration under conditions of 60° C., a vacuum degree of 100 Pa, and a pressure of 0.5 MPa using a vacuum laminating apparatus.

In this case, carbon flake was added to a conductive carbon paste by using a polystyrene-based resin as a binder, 50 parts by weight of carbon flake based on 100 parts by weight of the total amount of the resin was added and dispersed, and the conductive carbon paste was diluted with toluene so as to have a solid content of approximately 20 wt %, thereby manufacturing a conductive carbon paste.

Table 1 shows the performance of each of the organic-inorganic hybrid solar cells according to exemplary embodiments of the present specification, and FIG. 5 is a view illustrating a current density according to a voltage in each of the organic-inorganic hybrid solar cells manufactured in exemplary embodiments of the present specification.

TABLE 1

|  | PCE (%) | $J_{sc}$ (mA/cm$^2$) | $V_{oc}$ (V) | FF (%) |
|---|---|---|---|---|
| Example 1 | 11.6 | 18.2 | 1.06 | 60.6 |
| Comparative Example 1 | 2.3 | 8.8 | 0.64 | 41.2 |

In Table 1, $V_{oc}$, $J_{sc}$, FF, and PCE mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

In the case of a device manufactured by laminating the first structure and the second structure, which include a conductive adhesive layer as in Example 1, it can be confirmed that the excellent photoconversion efficiency is exhibited as compared to a case where an encapsulation film is applied after an upper electrode is formed as in Comparative Example 1. Through this, it can be seen that the organic-inorganic hybrid solar cell according to an exemplary embodiment of the present specification does not use a deposition process, and thus has good price competitiveness and also has excellent performance.

The invention claimed is:

1. An organic-inorganic hybrid solar cell, comprising:
a first electrode;
a first common layer provided on the first electrode;
a light absorption layer comprising a perovskite material provided on the first common layer;
a second common layer provided on the light absorption layer;
a conductive adhesive layer comprising a conductive composition provided on the second common layer so as to be brought into contact with the second common layer, the conductive composition comprising a conductive material and an adhesive material, wherein the adhesive material comprises an adhesive composition or a cured product of the adhesive composition, and the adhesive composition comprises a polymer derived from butylene and a polyfunctional active energy ray polymerizable compound selected from among 1,4-butanediol di(meth)acrylate, 1,3-butyleneglycoldi(meth)acrylate, 1,6-hexanedioldi(meth)acrylate, 1,8-otanedioldi(meth)acrylate, and 1,12-dodecanedioldi(meth)-acrylate; and
a base material on the conductive adhesive layer, wherein the base material comprises a barrier film that is a metal foil including one or more selected from the group consisting of silver (Ag), copper (Cu), molybdenum (Mo), palladium (Pd), and an alloy thereof,
wherein the perovskite material is a compound of Formula 2:

$$B_a B'_{(1-a)} M' X'_z X''_{(3-z)}$$ [Formula 2]

wherein in Formula 2,
B and B' are different from each other,
B and B' are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
M' is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$,
X' and X'' are each independently a halogen ion,
n is an integer from 1 to 9,
a is a real number such that 0<a<1,
z is a real number such that 0<z<3, and
wherein the conductive material comprises a carbon-based material selected from among graphite, graphene, carbon fiber, and carbon nanowire, and a content of the conductive material in the conductive composition is 30 wt % to 40 wt %; and
wherein the polymer derived from butylene is a single polymer of a butylene monomer, or a copolymer obtained by copolymerizing a butylene monomer and another polymerizable monomer, and
wherein the butylene monomer is selected from among 1-butene, 2-butene, and isobutylene, and the another polymerizable monomer is selected from among isoprene and butadiene,
wherein a viscosity of the conductive adhesive layer at a temperature in a range of about 15° C. to 35° C. is $10^6$ dyne·sec/cm$^2$ or more, and
wherein a sheet resistance value of the conductive adhesive layer is within a range of 0.01 Ω/sq to 100 Ω/sq.

2. The organic-inorganic hybrid solar cell of claim 1, wherein the base material further comprises a protective film.

3. The organic-inorganic hybrid solar cell of claim 1, wherein the polymer derived from butylene is a single polymer of a butylene monomer, or a copolymer obtained by copolymerizing a butylene monomer and another polymerizable monomer, wherein the butylene monomer is 1-butene or 2-butene, and the another polymerizable monomer is butadiene.

4. A method for manufacturing the organic-inorganic hybrid solar cell according to claim 1, the method comprising:
forming a first structure comprising: the first electrode, the first common layer, the light absorption layer comprising a perovskite material, and the second common layer;
preparing a conductive adhesive layer comprising a conductive composition comprising a conductive material and an adhesive material, wherein the adhesive material comprises an adhesive composition or a cured product of the adhesive composition, the adhesive composition comprises a polymer derived from butylene and a polyfunctional active energy ray polymerizable compound selected from among 1,4-butanediol di(meth)acrylate, 1,3-butyleneglycoldi(meth)acrylate, 1,6-hexanedioldi(meth)acrylate, 1,8-otanediol-di(meth)acrylate, and 1,12-dodecanedioldi(meth)-acrylate, the conductive material comprises a carbon-based material selected from among graphite, graphene, carbon fiber, and carbon nanowire, a content of the conductive material in the conductive composition is 30 wt % to 40 wt %, and the polymer derived from butylene is a single polymer of a butylene monomer, or a copolymer obtained by copolymerizing a butylene monomer and another polymerizable monomer, wherein the butylene monomer is selected from among 1-butene, 2-butene, and isobutylene, and the another polymerizable monomer is selected from among isoprene and butadiene;

preparing a base material comprising a barrier film that is a metal foil including one or more metals selected from the group consisting of silver (Ag), copper (Cu), molybdenum (Mo), palladium (Pd), and an alloy thereof on a first surface of the conductive adhesive layer; and laminating the second common layer and the conductive adhesive layer so that a second surface of the conductive adhesive layer opposite of the first surface of the conductive adhesive layer is in contact with the second common layer, wherein a viscosity of the conductive adhesive layer is $10^6$ dyne sec/$cm^2$ or more, and wherein a sheet resistance value of the conductive adhesive layer is within a range of 0.01 Ω/sq to 100 Ω/sq.

5. The method of claim 4, wherein the forming of the first structure comprises:

preparing the first electrode;

forming the first common layer on the first electrode;

forming the light absorption layer comprising a perovskite material on the first common layer; and forming the second common layer on the light absorption layer.

6. The method of claim 4, wherein laminating the second common layer and the conductive adhesive layer comprises using a roll at 20° C. to 100° C.

* * * * *